United States Patent [19]

Balanis et al.

[11] Patent Number: 5,045,819
[45] Date of Patent: Sep. 3, 1991

[54] MULTILAYER-MULTICONDUCTOR MICROSTRIPS FOR DIGITAL INTEGRATED CIRCUITS

[75] Inventors: Constantine A. Balanis, Mesa; James P. K. Gilb, Tempe, both of Ariz.

[73] Assignee: Arizona Board of Regents, a body corporate acting on behalf of Arizona State University, Tempe, Ariz.

[21] Appl. No.: 533,926

[22] Filed: Jun. 6, 1990

[51] Int. Cl.$^5$ .............................................. H01P 3/08
[52] U.S. Cl. ......................................... 333/1; 333/12; 333/238
[58] Field of Search ...................... 333/1, 12, 116, 238; 174/32, 36, 117 FF

[56] References Cited

U.S. PATENT DOCUMENTS 4,028,643 6/1977 Itoh ................................. 333/238 X
4,441,088 4/1984 Anderson ................................. 333/1

OTHER PUBLICATIONS

Rabbet, *Reducing Crosstalk in Microstrip Lines*, IBM Tech. Discl. Bulletin, vol. 18, No. 5, Oct. 1975, pp. 1430–1435.
Young et al., *Analysis of Coupled Microslab Lines*, IEEE Trans. on MTT, vol. 36, No. 3, Mar. 1988, pp. 616–619.

*Primary Examiner*—Paul Gensler
*Attorney, Agent, or Firm*—Richard R. Mybeck

[57] ABSTRACT

A multilayer-multiconductor microstrip circuit having reduced dimensions and minimal pulse distortion and crosstalk for high-speed, high-density digital application is created utilizing a microstrip having a plurality of substrates, each having a preselected dielectric constant of a magnitude which, combined with the height of each substrate, produces effective dielectric constants of the independent propagating nodes which are substantially equal.

16 Claims, 10 Drawing Sheets 5,045,819

MULTILAYER-MULTICONDUCTOR MICROSTRIPS FOR DIGITAL INTEGRATED CIRCUITS

FIELD OF THE INVENTION

The present invention relates to a multilayer-multiconductor microstrip circuit having minimum pulse distortion due to coupling and minimizing crosstalk for high-speed, high-density digital applications.

BACKGROUND OF THE PRESENT INVENTION

Microstrip transmission lines are often used to transmit signals between electrical circuits and devices. In high-speed, high-density digital applications, the transmitted signal is made up of a series of short pulses. When the pulses in the signal are very short in time, their shape distorts as they travel down the line. This distortion is a result of three different mechanisms, namely, (1) dispersion, that is, each frequency component travels at a different speed; (2) attenuation, that is, part of the signal is dissipated as heat; and (3) coupling (crosstalk), that is, energy from the signal in the main line is transferred to adjacent line(s). All three of these mechanisms distort the shape of the pulse and reduce its amplitude. However, the mechanism of coupling (crosstalk) also creates one or more unwanted signals on adjacent line(s), which can cause errors in the operation of the circuit.

Previously, the center conductor in a transmission line required relatively large spaces between adjacent center conductors in order to avoid the problems of coupling, pulse distortion, and crosstalk. This solution, however, makes the dimensions of the circuits much larger overall, increases the amount of energy lost, and reduces the net speed of the circuit operation. N. B. Rabbat (See: *IBM Technical Disclosure Bulletin* vol. 8, No. 5, pp. 1430-1435, Oct. 1975) describes a technique for reducing crosstalk in microstrip transmission lines using extra ground holes. Crosstalk was reduced by about 60% experimentally but did not eliminate it completely. In addition, additional fabrication effort is required to create the extra ground holes.

U.S. Pat. No. 4,441,088 describes a stripline cable where there is a plurality of signal carrying conductors embedded in a dielectric layers above and below the signal conductors are chosen to provide the transmission lines with a certain impedance value and so that the coupling between the lines is minimized. Since the transmission lines are embedded in a dielectric layer, it is very difficult to mount standard digital chip packages, making this type of interconnection unsuitable for many high-speed applications. In addition, embedding the signal carrying conductors in the dielectric requires additional fabrication effort.

Thus, non of the previous solutions for reducing crosstalk and coupling is totally satisfactory and a need still exists to enhance the performance of multilayer-multiconductor microstrip circuits. It is toward the fulfullment of this need that the present invention is directed.

BRIEF SUMMARY OF THE INVENTION

The present invention provides means and methods which substantially eliminate crosstalk and minimize the coupling distortion of the pulsed signals between the adjacent lines of multiconductor, multilayer microstrip transmission lines, even when those lines are disposed in close proximity to each other. To accomplish this with a two-layer structure, the upper substrate is chosen to have a dielectric constant that is much greater than the lower substrate. For multilayer structures the upper-most substrate is chosen to have a dielectric constant that is greater than the dielectric constant of lower-most substrate and at least one of the center substrates must have a dielectric constant that is significantly lower than that of the upper-most substrate or significantly greater than that of the lower-most substrate. For each such combination, the height of the substrate must be selected using the technique and benchmarks described herein. The present invention, when applied to high-speed, high-density digital integrated circuits allows much smaller circuit dimensions and faster circuit switching.

Accordingly, a primary object of the present invention is to provide a new and improved means and methods for constructing multilayer-multiconductor microstrips in which the several modes thereof have substantially the same transmission velocity.

Another object of the present invention is to provide a new and improved multilayer-multiconductor microstrip having virtually no coupling distortion or crosstalk between adjacent signal conductors.

These and still further objects as shall hereinafter appear are readily fulfilled by the present invention in a remarkably unexpected manner as will be readily discerned from the following detailed description of exemplary embodiments thereof especially when read in conjunction with the accompanying drawing.

DESCRIPTION OF THE PREFERRED EMBODIMENT

Figure 1:
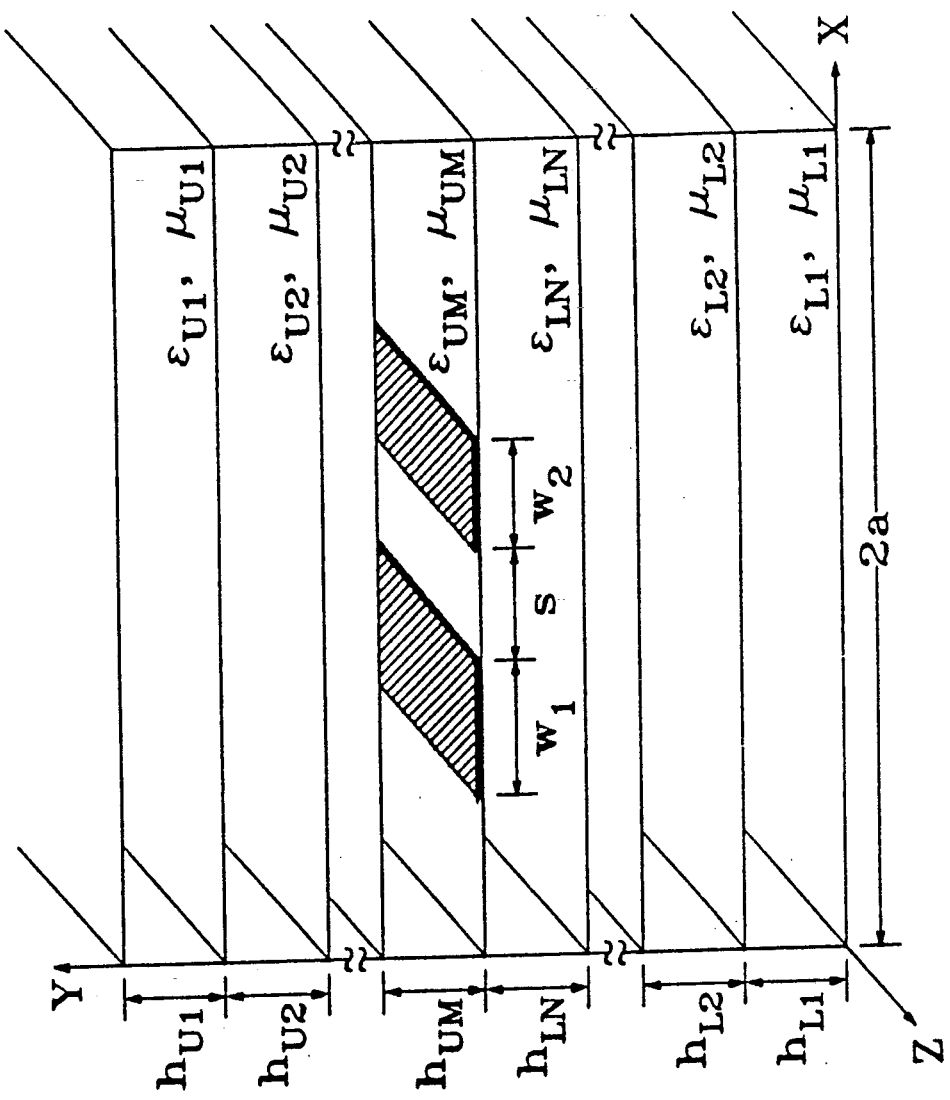
FIG. 1 is a graphic illustration of a general multilayer, multiconductor microstrip structure.

Microstrip transmission lines are constructed by placing one or more layers of dielectric materials, called substrates, on top of a large metal sheet and then locating one or more thin metal strips on top of the layers. The metal strips are called center conductors, and in a given transmission line structure there may be several center conductors each having different widths and with different spacings. In addition, there may be dielectric layers placed on top of the center conductors, called superstrates. Additionally, the entire structure may be enclosed in a rectangular metal box, called a "shielded microstrip," or may have only a metal sheet above the superstrates with no side walls, called a "covered microstrip." The complete configuration, with two center conductors of widths $w_1$ and $w_2$ and separation s, is shown in FIG. 1 as a shielded microstrip. Open microstrips can be analyzed by the same geometry when the side wall spacing, 2a, and the height of the uppermost superstrate, $h_{U1}$, are extended to infinity. Similarly, covered microstrips can be modeled by extending the side wall spacing, 2a, to infinity while maintaining the height of the substrate layers at a finite value.

The electrical properties (dielectric constant, conductivity, and relative permeability) of the dielectric material that is employed in the substrates and superstrates, as well as their heights and placement, substantially affect the characteristics of the microstrip line, particularly the shape of the pulses and the speed at which a signal travels down the line. Microstrip performance is also affected by the width of the center conductors and the distance between adjacent center conductors in a multiconductor microstrip.

Figure 2:
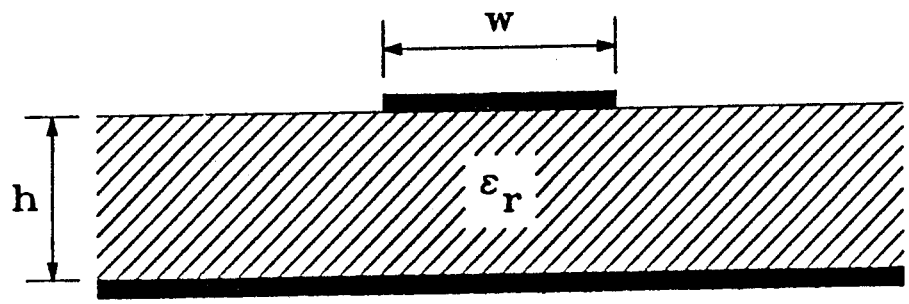
FIG. 2 is a graphic illustration of a single-layer, single-conductor microstrip.
Figure 3:
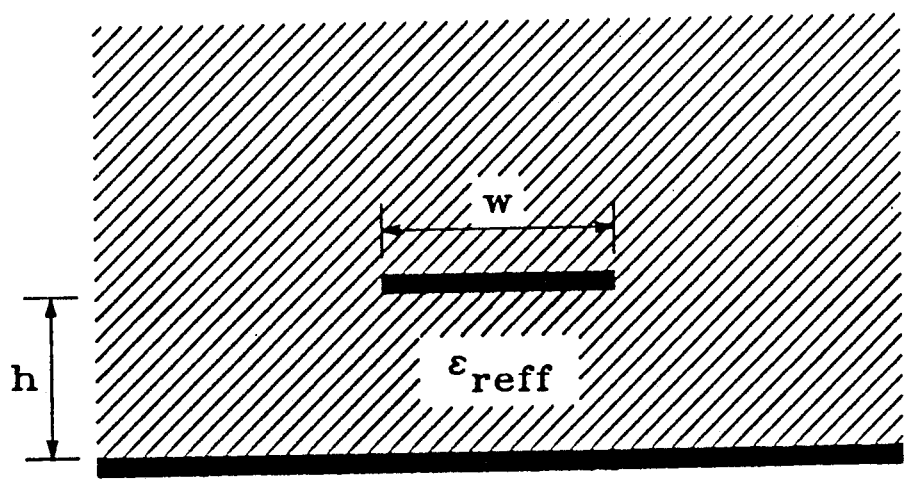
FIG. 3 is a graphic illustration of a microstrip structure with only a single dielectric material whose electrical characteristics are equivalent to those of the structure in FIG. 2.

One of the most important parameters which characterizes a microstrip line is the relative effective dielectric constant, $\epsilon_{reff}$, of the structure. The concept of relative effective dielectric constant can best be understood by considering a one-layer microstrip structure as shown in FIG. 2. If a center conductor of the same width and at the same height as the device shown in FIG. 2 is surrounded by a single dielectric material, as shown in FIG. 3, the relative dielectric constant of the surrounding material which will give the structure in FIG. 3 the same performance characteristics as those obtained by the microstrip stucture of FIG. 2, at a given frequency, is called the "relative effective dielectric constant." Relative effective dielectric constant concept can also be applied to multilayer, multiconductor microstrip structures, although each additional center conductor adds another independent mode, and hence another $\epsilon_{reff}$ associated with that mode. Thus for two center conductors, there are two modes and two $\epsilon_{reff}$ values associated with the structure. Among other things, $\epsilon_{reff}$ determines the speed at which a signal travels in a microstrip line. In addition, the frequency characteristics of the $\epsilon_{reff}$ values of the structure are responsible for pulse distortion due to dispersion. Thus the accurate calculation of all $\epsilon_{reff}$ values associated with a given structure is essential to computing the distortion of a pulse traveling along the structure.

Many different methods can be used to determine the $\epsilon_{reff}$ values in conjunction with the practice of this invention. These methods should share the following characteristics. First, the method must be able to determine $\epsilon_{reff}$ accurately over a wide range frequencies. Second, the method must be able to compute $\epsilon_{reff}$ values for structures that contain at least two, but possibly more, substrate layers. Third, the method needs to be capable of computing $\epsilon_{reff}$ for both the even and odd (or c and $\pi$) modes. Finally, the method should be able to perform all of these with a minimum of time on the computer. For the figures shown in this description, the Spectral Domain Approach described by Itoh et. al. (See: *IEEE Trans. Microwave Theory Tech.*, vol. MTT-21, pp. 496–499, July 1973) with the modifications described by Gilb et. al. (See: *IEEE Trans. Microwave Theory Tech.*, vol. MTT-37, pp. 1620–1628, Oct. 1989 and in *IEEE MTT-S Int. Microwave Symp. Dig.*, 1989, pp. 1001–1004) is used to compute $\epsilon_{reff}$.

For coupled microstrip lines, there are three independent mechansims which degrade the pulse, namely, dispersion, attenuation, and coupling (crosstalk). The present invention addresses the problems of coupling distortion and crosstalk in microstrip lines. For pulsed operation, the coupling on a microstrip line occurs because there are two modes that exist for coupled transmission lines. When both lines have the same width (symmetric coupled lines), the modes are referred to as even and odd modes. When the lines have different widths (asymmetric coupled lines), the modes are called c and $\pi$ modes. In both symmetric and asymmetric lines, the cause of coupling distortion and crosstalk is the same, namely the two modes travel at different speeds.

Figure 4:
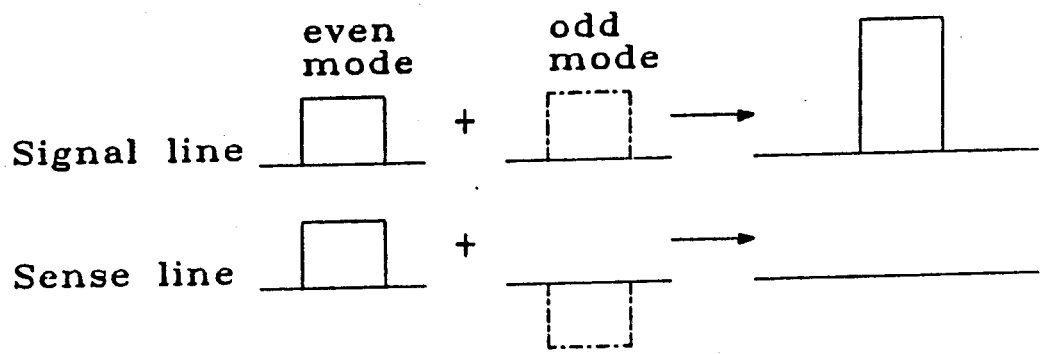
FIG. 4 is a graphic illustration of how an input pulse may be split into even and odd modes.

The effect of coupling distortion and crosstalk on two adjacent transmission lines can be visualized by converting the input pulse into two sets of pulses, called the even and odd modes. Consider a signal of unit amplitude that is applied to one line, called the signal line, and that nothing is applied to the adjacent line, called the sense line, as shown in FIG. 4. When the input signal is split into two different signals, an even mode and an odd mode is created. The even mode consists of two positive pulses of one-half amplitude. The odd mode, on the other hand, consists of two pulses of one-half amplitude with a positive pulse on the signal line and a negative pulse on the sense line. When the even and odd modes are added together, the positive pulses add to recreate the original signal on the signal line, while on the adjacent line the positive and negative pulses cancel each other, giving no signal.

As long as the even and odd modes travel together, i.e. at the same speed, coupling will not distort the pulse on the signal line nor will there be an extra signal introduced on the sense line. However, in most types of transmission lines, the even and odd modes move at different speeds as they travel down the line and so the even and odd mode pulses do separate as the signal moves along the line.

Figure 5:
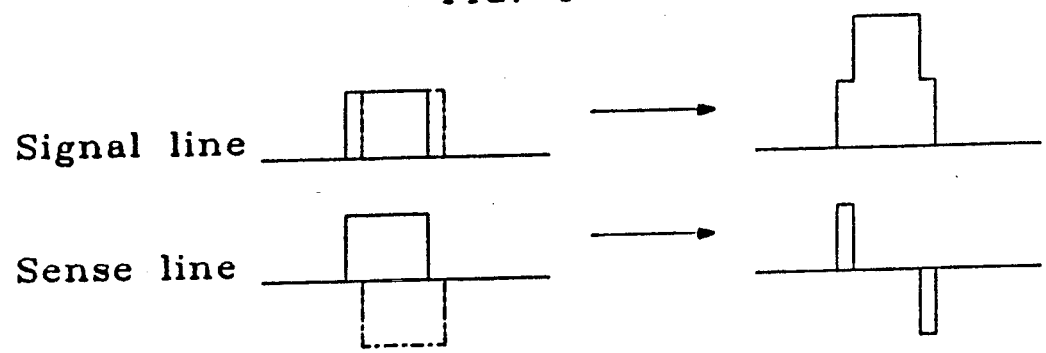
FIG. 5 is a graphic illustration of how the differences in the speed of the even and odd modes cause coupling, pulse distortion, and crosstalk after a short distance.
Figure 6:
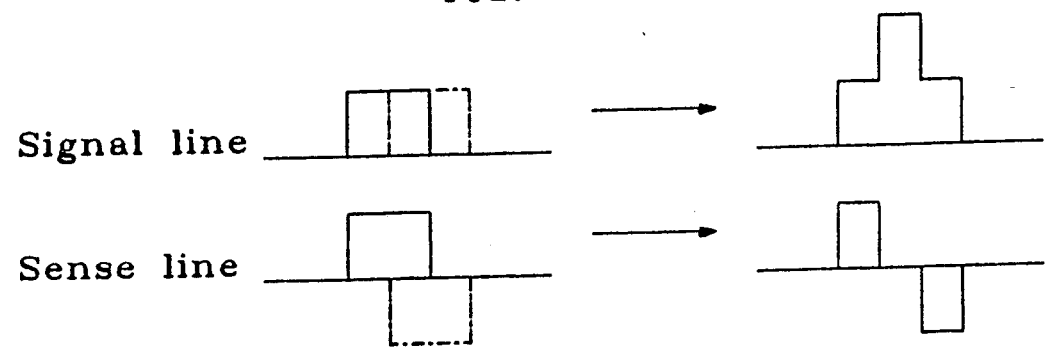
FIG. 6 is a graphic illustration of how the longer distances result in increased coupling, pulse distortion, and crosstalk due to the differences in the speed of the even and odd modes.
Figure 7:
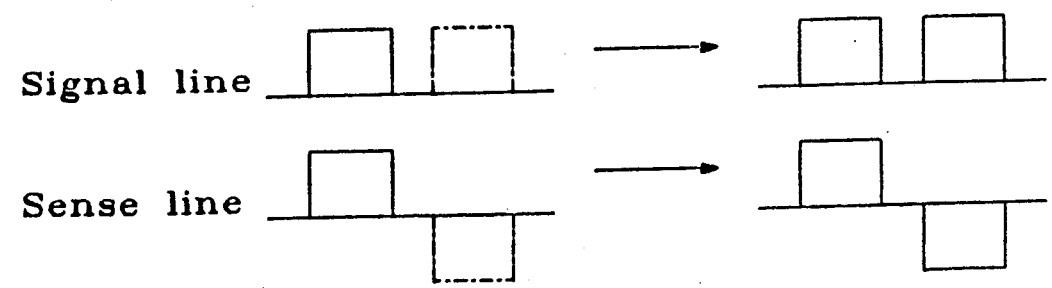
FIG. 7 is a graphic illustration after a very long distance, the difference in the even and odd mode speeds will cause the input pulse to be significantly distorted and create a high level of crosstalk on the adjacent transmission line.

When the pulse first starts out, the even and odd pairs have not separated very much, and almost completely cancel each other on the sense line and reproduce the pulse fairly accurately on the signal line, as shown in FIG. 5. As the pulse travels farther, FIG. 6, the even and odd pairs begin to separate. When the pairs move at different speeds, they no longer cancel completely on the sense line or reproduce the original pulse accurately on the signal line. The signal line response has also been widened and the leading and trailing edges have dropped off in amplitude causing distortion of the intended pulse. After the pulse has traveled a very long distance, as shown in FIG. 7, the even and odd mode pairs separate completely and there are now two positive pulses of one-half amplitude on the signal line and two pulses of one-half amplitude, one positive and one negative, on the sense line. On an actual transmission line, other distortion factors such as dispersion and attenuation will also affect the pulse shape. The same analysis is equally applicable to pulse distortion on asymmetric coupled lines using c and $\pi$ modes instead of the even and odd modes.

Figure 8:
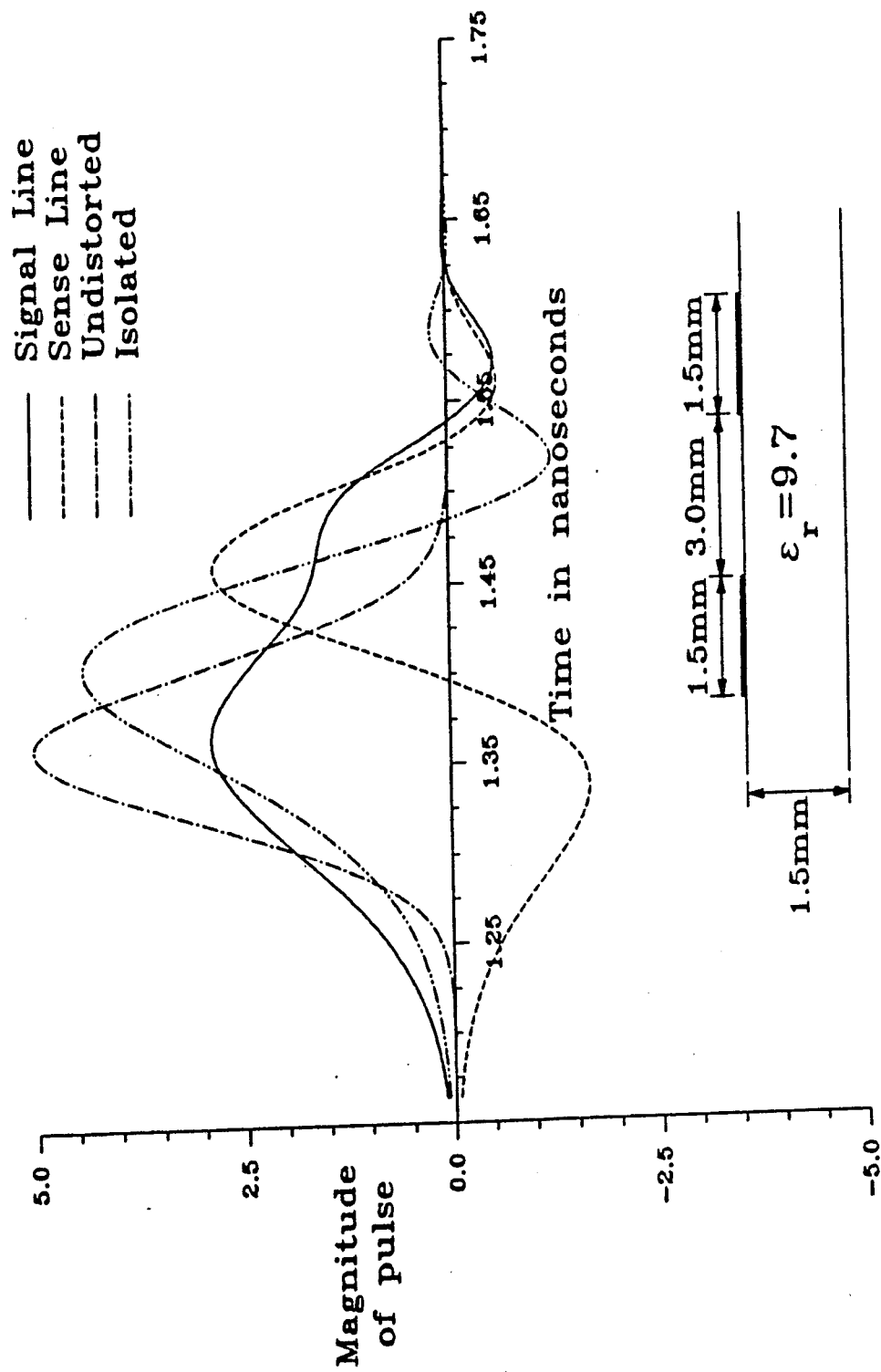
FIG. 8 is a graphic illustration of pulse propagation with dispersion and coupling on coupled microstrip lines for a single-layer structure.

Refering to FIG. 8, the effect of pulse distortion on coupled microstrip lines using previous microstrip structures is demonstrated and the response on a single isolated line on the same structure and an undistorted pulse are included for reference. The undistorted pulse represents the ideal response which is the original pulse shifted in time. The substrate is alumina (relative dielectric constant, $\epsilon_r$, of 9.7) having the dimensions as shown in FIG. 8. A Gaussian pulse is sent down the signal line, with no pulse on the sense line. The response of each line is monitored at a distance of 160 mm. The isolated line graph shows that dispersion changes the pulse shape slightly, but that it is still recognizeable as the original pulse. The differences between the signal line response and the isolated line response show the effect of coupling distortion on a pulse. As shown, coupling distortion accounts for a 30 percent reduction in the signal amplitude and widens the pulse significantly in time. Meanwhile, the sense line response has risen to 56 percent of the original pulse and is almost the same amplitude as the intended response on the signal line. This false pulse on the sense line, referred to as crosstalk, can cause serious errors in the operation of digital integrated circuits and in the equipment depended thereon for receiving accurate "messages."

For all single substrate microstrip structures, including the one shown in FIG. 8, the odd mode travels faster than the even mode so that coupling distortion and crosstalk is always a potential problem. However, for multilayer structures, this is not always the case. For certain combinations of substrate heights and dielectric constants, the even mode is faster than the odd mode. The effect of disparate rates of travel by the modes upon the signal occurs irrespective of which mode is the fastest.

The present invention is predicated upon our discovery of criteria which enables structures to be built in which even/odd (or c/$\pi$) modes have the same velocity and, as will hereinafter be described in detail, permits the construction of high-speed, high-density digital integrated microstrip circuits having virtually no coupling distortion of the pulse or crosstalk between adjacent signal conductors.

In practice, the fabrication of these low-coupling structures begins by determining the number of substrates desired in the microstrip structure and the width and spacings for each of the center conductors. Next, the dielectric constants ($\epsilon_r$) of the substrate layers are be chosen. For a two-layer structure, the upper substrate must have a dielectric constant that is significantly greater than that of the lower substrate. For structures having more than two substrate layers, the upper-most substrate must have a dielectric constant that is greater than the dielectric constant of the lower-most substrate and at least one of the intermediate substrates must have a dielectric constant that is either significantly lower than that of the upper-most substrate or significantly greater than that of the lower-most substrate. Examples of such multilayer configurations are described below. Initial values for the height of each substrate is chosen and the effective dielectric constants for the even and odd (or c and $\pi$) modes are calculated using the procedure described by Gilb et. al. (op. cit.). If the effective dielectric constants of the even and odd (or c and $\pi$) modes are essentially the same, then the correct circuit dimensions have been found. If the effective dielectric constants are not the same, new heights are chosen and the process is repeated until the correct values for the substrate heights are found. If it is not possible to find combinations of the substrate heights that equalize the speeds of the modes using the original dielectric constants values, then new dielectric constants need to be chosen, either increasing the dielectric constant of the upper-most substrate or decreasing that of the lower substrate.

The above iterative method is easily accomplished and if desired, a computer program can be utilized to expedite the process. As is apparent the circuit fabricator needs only specify the dielectric constants and place appropriate constraints on the substrate height. Then the computer program will return the appropriate values for the substrate heights. If the values of the substrate heights cannot be varied, then one should determine the dielectric constants necessary to equalize the speeds of the modes. In practice, it will be easier to vary the substrate height than to find a material having an arbitrary dielectric constant.

Determining the correct height combinations in the manner described completes the first phase of the fabrication process because it was done at a single frequency only. The process is then repeated at enough frequencies to characterize the significant portion of the pulse spectrum. It is preferred that the height combinations that lead to low-coupling be the same for all of the frequencies in the pulse spectrum. Although the height combinations do not change very much with frequency, they are not the same for all frequencies, and so the circuit fabricator must then choose, based on the pulse used, the values of the substrate heights which minimize the overall crosstalk and pulse distortion. Specific examples of how this is accomplished shall now be presented to enhance understanding of the present invention and not by way of limitation.

Figure 9:
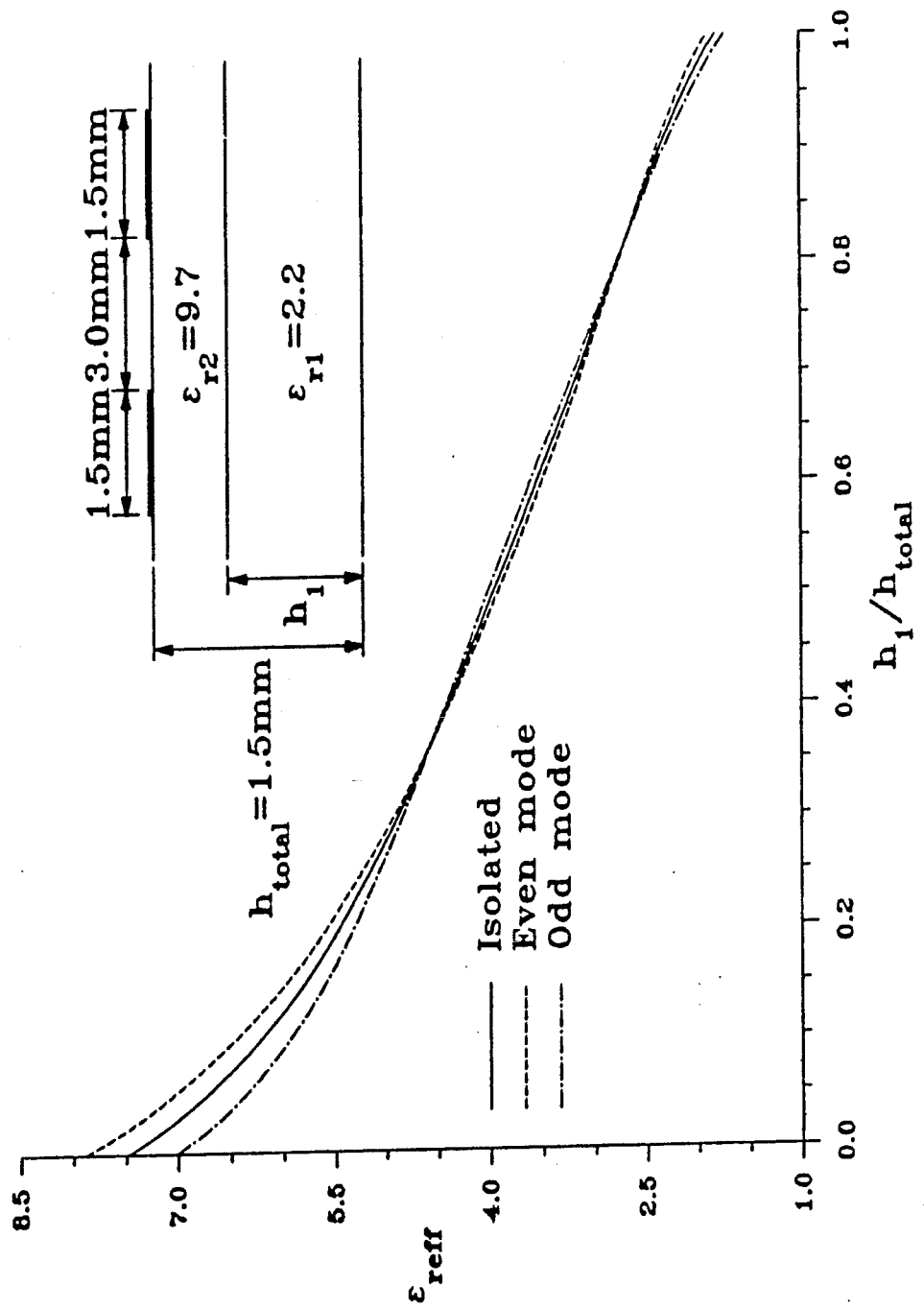
FIG. 9 is a graphic illustration of the behavior of effective dielectric constants of the even and odd modes for a two-layer symmetric coupled microstrip at a single frequency of operation for various values of the height of the dielectric substrates when the sum of the heights of the dielectric substrates is held constant.
Figure 10:
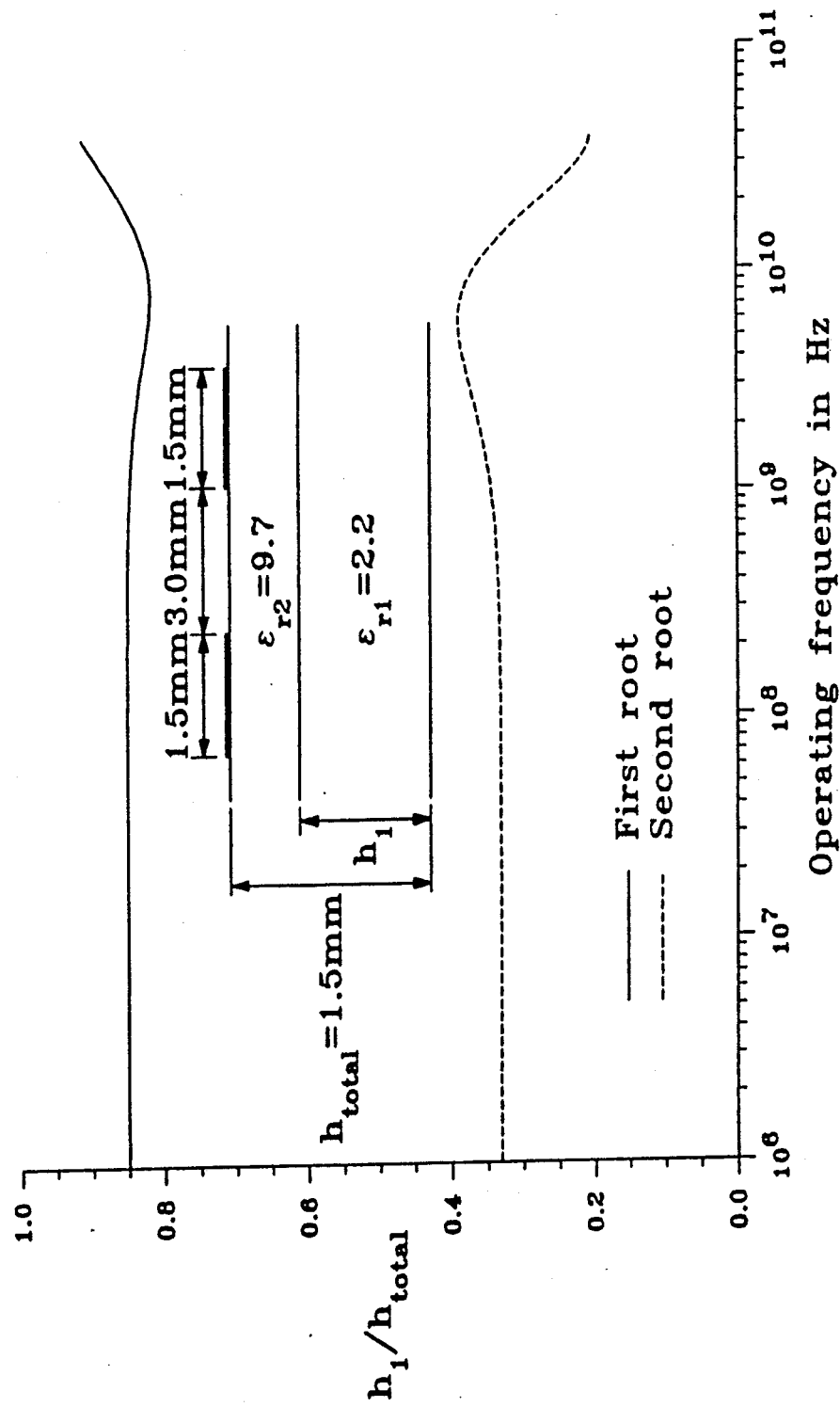
FIG. 10 is a graphic illustration of the values of the ratio of the lower substrate height to the total substrate height which result in the even and odd modes having substantially the same effective dielectric constants.

The first example produces a two-layer structure which is prepared having alumina ($\epsilon_r = 9.7$) as the chosen upper substrate and polyethylene ($\epsilon_r = 2.2$) as the chosen lower substrate. The total height of the substrate layers is fixed at 1.5 mm as shown in FIGS. 9 and 10 and the center conductors are symmetrically placed with a separation of 3.0 mm and widths of 1.5 mm. The relative effective dielectric constant of the structure is then plotted as a function of lower substrate height, as shown in FIG. 9, for the even mode, odd mode, and the isolated or single center conductor case at a frequency of 10 GHz. Note that $\epsilon_{reff}$ for the even and odd modes cross at two different values of the lower substrate height. Either of these values becomes one of the substrate height values that can be used to build the low coupling structure.

Figure 11:
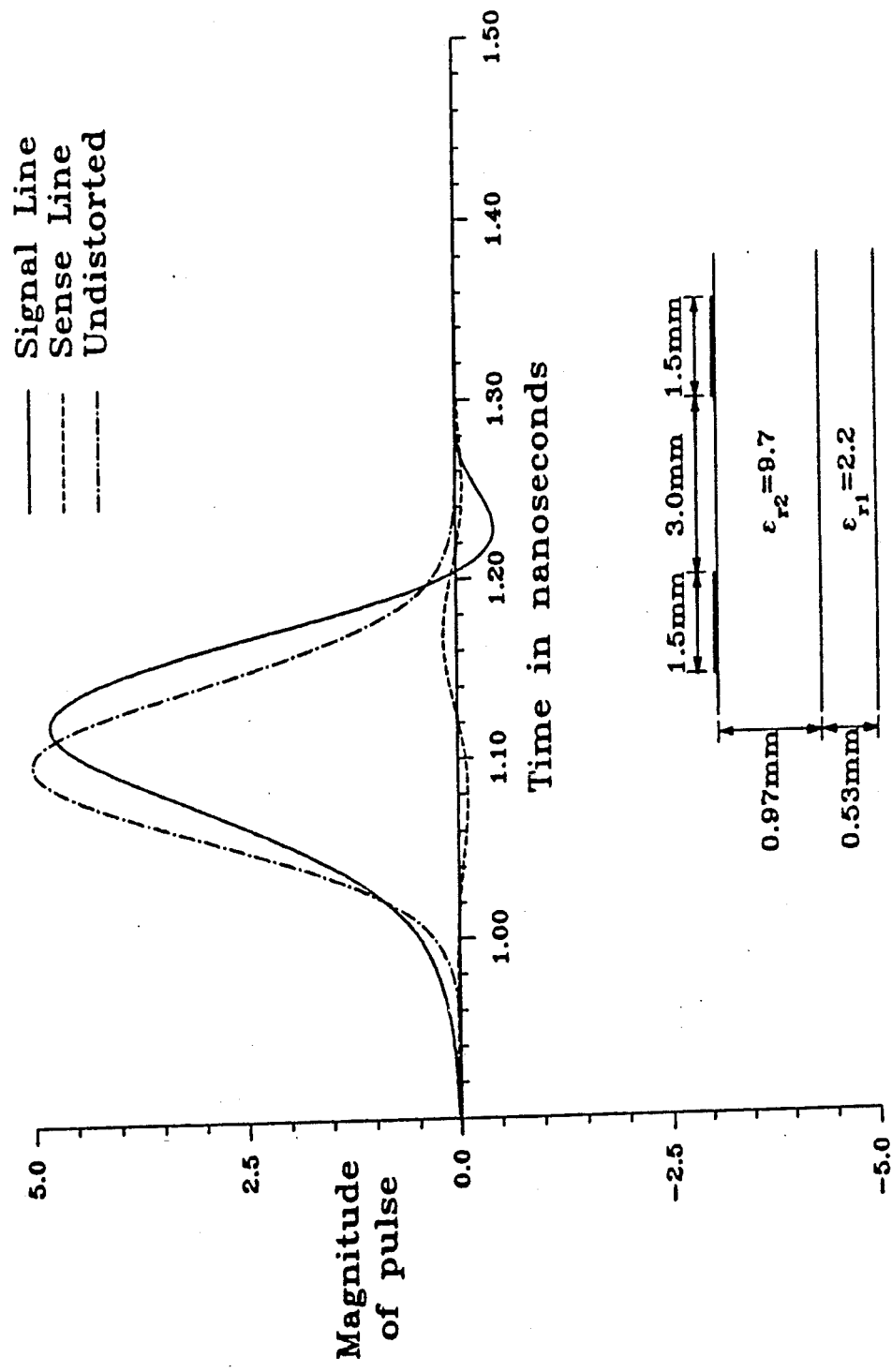
FIG. 11 is a graphic illustration of the distortion of a pulse on coupled microstrip lines for a two-layer, low-coupling structure.

Next, the values of these low-coupling points are determined at frequencies which make up the most significant portion of the pulse's frequency spectrum. Using a numerical root finder, these values are computed as shown in FIG. 10. Using the graph of FIG. 10 and information about the pulse (See Gilb et. al., op. cit.), a value of the substrate height which will greatly reduce the amount of coupling distortion and crosstalk is selected. Accordingly, the substrate layer heights are chosen as 0.53 mm for the lower layer and 0.97 mm for the upper layer. The result for the pulse distortion is shown in FIG. 11 at a distance of 160 mm, the same distance used in FIG. 8, with the same center conductor configuration. In FIG. 11, the isolated line response is not shown because it is essentially the same as the signal line response. Since the difference between the isolated line and the signal response graphs represents the distortion due to coupling, it is evident that coupling distortion has been essentially eliminated from this structure. Also note that the sense line response (crosstalk) is barely visible, 3.2 percent of the undistorted pulse, compared with the large response in FIG. 8, showing that the crosstalk has also been almost completely eliminated.

Figure 12:
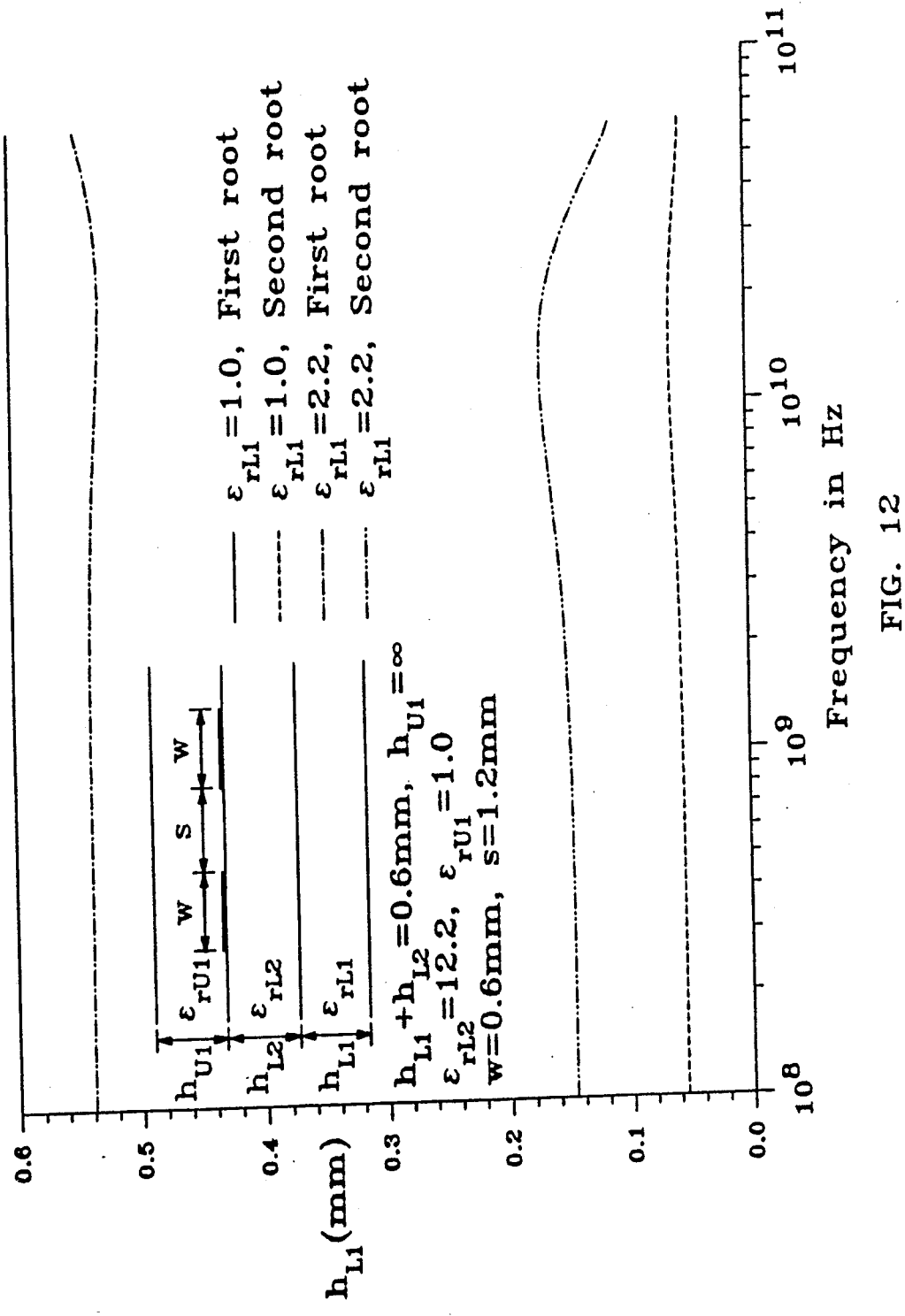
FIG. 12 is a graphic illustration of the location of the zero coupling points for a two-layer, low-coupling structure using gallium arsenide on polyethylene and on air.

Low coupling structures can also be built on a wide variety and combination of substrate materials. As shown in FIG. 12, gallium arsenide is used as the upper most substrate ($\epsilon_r=12.2$) and both air ($\epsilon_r=1.0$) and polyethylene ($\epsilon_r=2.2$) are used for the lower substrate. The dimensions and the low-coupling points, computed as a function of frequency for this structure, are shown in FIG. 12. Either lower substrate can be used to create a low coupling structure, however, the heights that must be chosen for each fabrication are different for each substrate. The locations of the zero coupling points also change as the center conductor spacing changes, but are not as sensitive to the spacing changes in the center conductor spacing as they are to changes in the dielectic constant.

Figure 13:
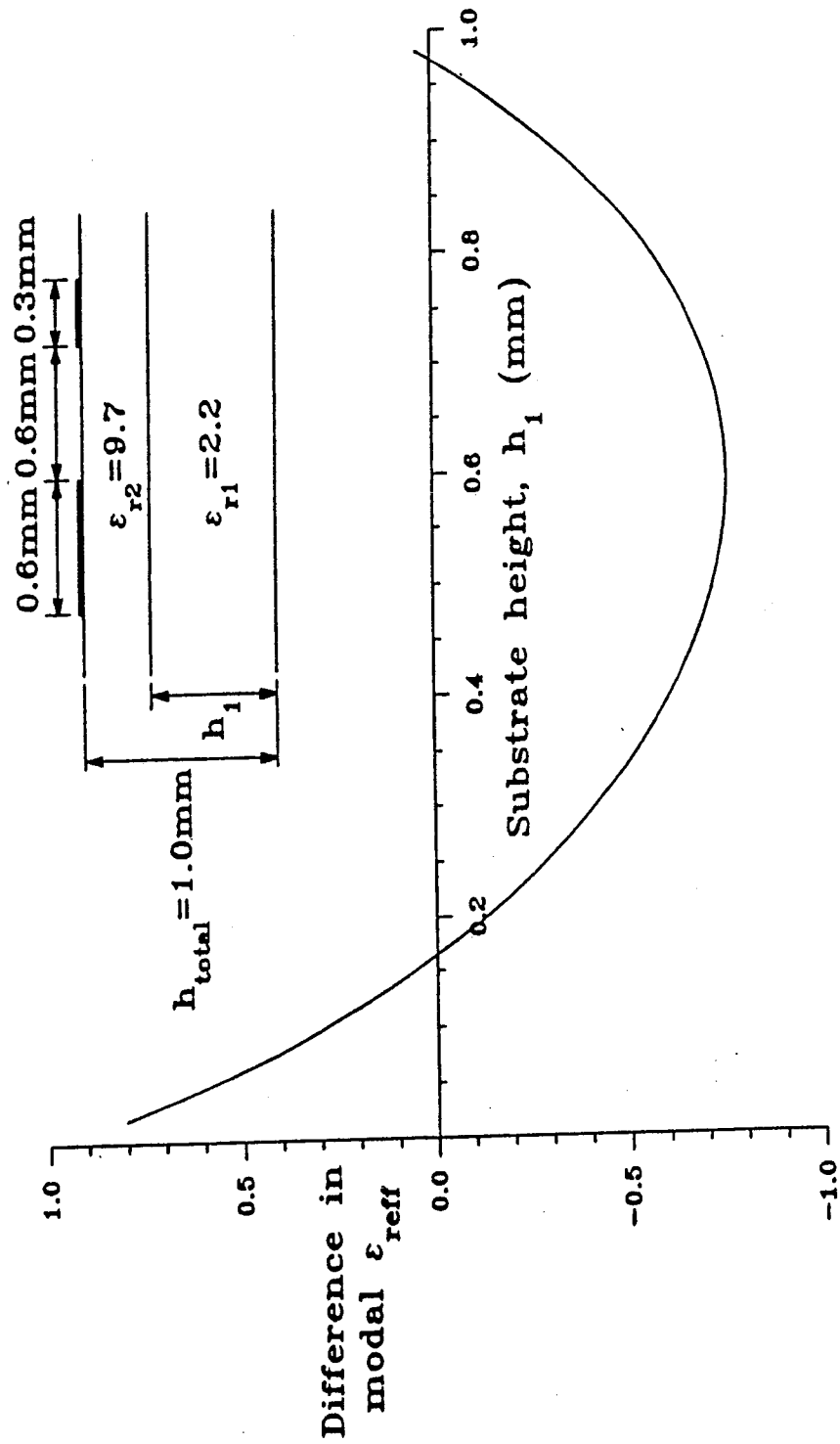
FIG. 13 is a graphic illustration of the difference between the relative effective dielectric constants for the c and $\pi$ modes of a two-layer, asymmetric coupled microstrip structure.

Using the present invention, it is also possible to create low-coupling structures having asymmetric lines as well as symmetric lines. An example of an asymetric fabrication comprises a structure with two substrates, alumina being the upper substrate and polyethylene being the lower substrate. The total height of both substrates is 1.0 mm. The center conductors are separated by 0.6 mm and one is 0.6 mm wide, while the other is 0.3 mm wide (See: FIG. 13). The effective dielectric constants for the c and 90 modes are computed as a function of the lower layer height at a frequency of 1 GHz. The difference between these two values is then plotted versus the lower layer height. The zero even/odd mode coupling points occur where the graph crosses the x-axis. Thus, structures with the dimensions $h_{L1}=0.16$ mm and $h_{L2}=0.84$ mm or $h_{L1}=0.97$ mm and $h_{L2}=0.03$ mm will provide extremely low coupling distortion.

Figure 14:
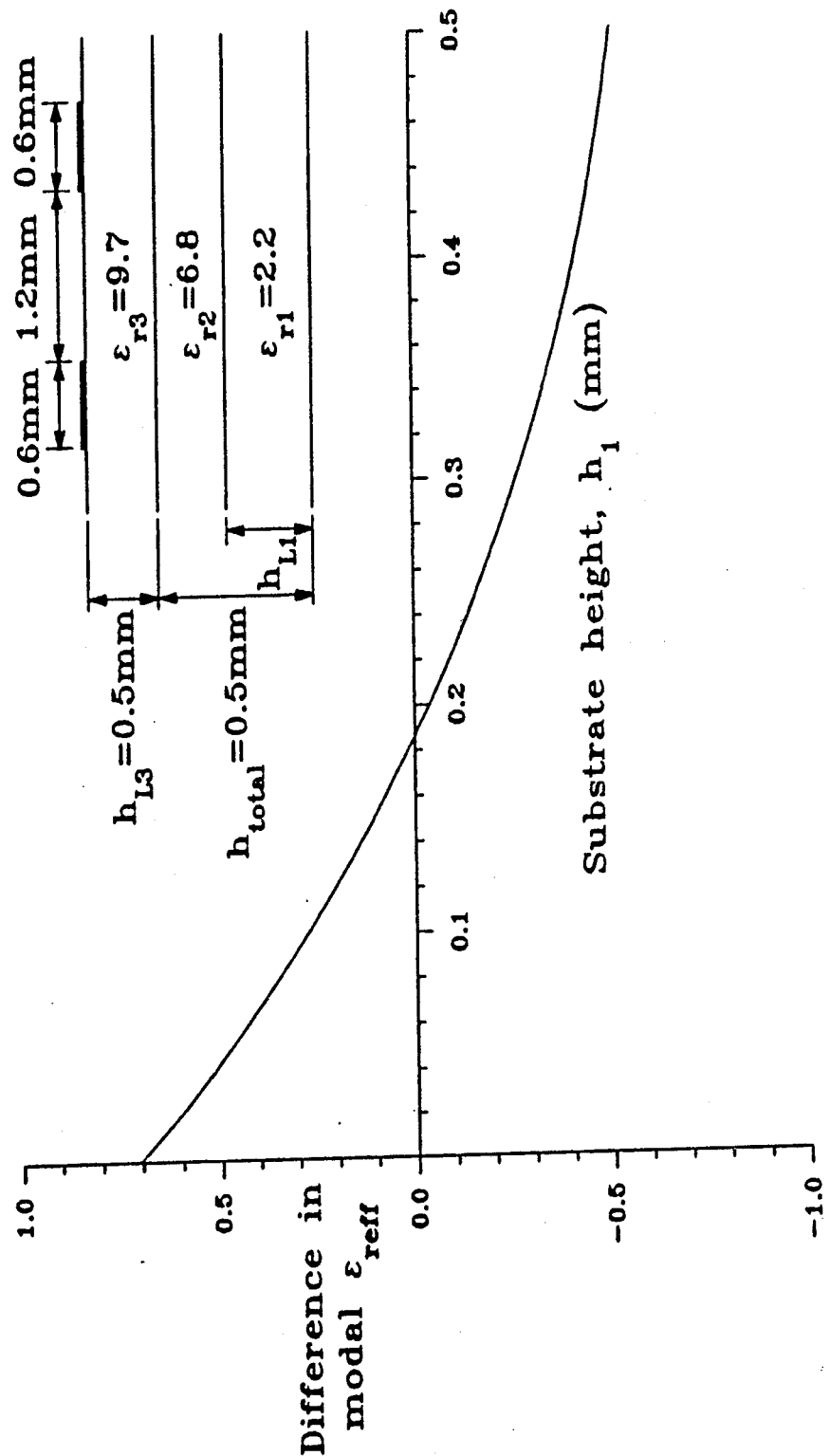
FIG. 14 is a graphic illustration of the difference between the relative effective dielectric constants for the even and odd modes for a three-layer, symmetric coupled microstrip structure.

The present invention is likewise applicable to a wide variety of multilayer structures. Thus, a three-layer structure having substrates made of alumina, beryllium oxide, and polyethylene is laid out. The upper substrate layer is fixed at 0.5 mm in height and the sum of the heights of the two lower layers is also fixed at 0.5 mm, as shown in FIG. 14. Each center conductor is 0.6 mm wide, and they are separated by 1.2 mm. With the frequency fixed at 1 GHz, the lower substrate height is varied and the difference between the $\epsilon_{reff}$ for even and odd modes is calculated. The results of these calculations are shown in FIG. 14. Note that there is only one combination of the substrate heights that gives zero coupling, $h_{L1}=0.187$ mm and $h_{L2}=0.313$ mm.

Another three-layer structure is prepared with gallium arsenide as the upper-most substrate, alumina as the lower-most substrate, and air as the intermediate substrate. The center conductor widths of 0.6 mm, a spacing of 1.2 mm, an upper-most layer height of 0.5 mm, and a total of the lower substrate heights of 0.5 mm are used as before. However, in this specimen, the relative dielectric constant of the upper-most substrate ($\epsilon_r=12.2$) is not significantly greater than that of the lower-most substrate ($\epsilon_r=9.7$), but the dielectric constant of the center layer ($\epsilon_r=1.0$) is significantly less than that of the upper-most layer. Thus at a frequency of 1 GHz, the zero-coupling configuration is computed to be, $h_{L1}=0.43$ mm and $h_{L2}=0.07$ mm.

In still another three-layer structure, quartz is chosen for the upper substrate ($\epsilon_r=3.8$), alumina for the middle substrate ($\epsilon_r=9.7$), and polyethelene for the lowest substrate ($\epsilon_r=2.2$). The height of the upper most substrate is set at 0.2 mm, the sum of the heights of the two lower substrates is fixed at 1.0 mm, and the center conductor configuration is the same as used in the two previous examples. For this structure, at 1 GHz, there are two possible combinations of substrate heights that will give zero coupling, $h_{L1}=0.54$ mm, $h_{L2}=0.46$ mm and $h_{L1}=0.93$ mm, $h_{L2}=0.07$ mm.

Although it is desirable to eliminate as much coupling as possible by using structures having the zero-coupling points, significant reduction in coupling distortion and crosstalk is obtained with values which are near, but not exactly on these points. In some cases, no height combination will exactly equalize the $\epsilon_{reff}$'s; however, it is often possible to find a point that minimizes the difference and thereby greatly reducing the coupling by using the method of the present invention.

There are many advantages to be realized by using the new method of coupling reduction for high-speed, high-density digital integrated circuits. First, the modification does not interfere with the circuit layout. Second, the structural specifications are not very sensitive, and so small inaccuracies in the manufacturing process will not significantly affect the performance. In addition, the method is applicable to a wide range of geometries, including symmetric and asymmetric transmission lines, structures with more than two layers below the transmission lines, as well as structures that are enclosed in boxes used in high-speed, high-density digital integrated circuits. Finally, the addition of the extra layer increases the actual speed with which the pulses travel, further adding to the net increase in operational speed and performance of the circuit.

From the foregoing, it becomes apparent that new and useful means and methods have been herein described and illustrated which fulfill all of the aforestated objectives in a remarkably unexpected fashion. It is of course understood that such modifications, alterations and adaptations as may readily occur to an artisan having the ordinary skills to which this invention pertains are intended within the spirit of the present invention which is limited only by the scope of the claims appended hereto.

Accordingly, what is claimed is:

1. A microstrip having a plurality of independent propagating modes and comprising a plurality of coplanar center conductors and a plurality of substrates disposed in a vertical stack upon a ground plane and including an uppermost substrate, a lowermost substrate, said uppermost substrate having a dielectric constant which is substantially greater than the dielectric constant of said lowermost substrate, each substrate having a height sufficient to enable the effective dielectric constants of said independent propagating modes to be substantially equal, said center conductors being disposed upon said uppermost substrate.

2. A coupled microstrip according to claim 1 in which said center conductors have different widths.

3. A microstrip according to claim 1 having only two independent propagating modes, in which one of said modes is even and the other of said modes is odd.

4. A microstrip according to claim 1 having only two independent propagating modes, in which one of said modes is c and the other of said modes is $\pi$.

5. A microstrip having a plurality of independent propagating modes and comprising a plurality of coplanar center conductors and a plurality of substrates disposed in a vertical stack upon a ground plane and including an uppermost substrate, a lowermost substrate, and one or more intermediate substrates operatively interposed between said uppermost and said lowermost substrate, said uppermost substrate having dielectric constant which is higher than the dielectric constant of said lowermost substrate, one of said intermediate substrates having a dielectric constant which is substantially different from the dielectric constant of at least one of the dielectric constants of said uppermost substrate and said lowermost substrate, each substrate having a height sufficient to enable the effective dielectric constants of said independent propagating modes to be substantially equal, said center conductors being disposed upon said uppermost substrate.

6. A microstrip according to claim 5 having only two independent propagating modes in which one of said modes is even and the other of said modes is odd.

7. A microstrip according to claim 6 in which said dielectric constant of said one of said intermediate substrates is substantially less than the dielectric constant of said uppermost substrate.

8. A microstrip according to claim 6 in which said dielectric constant of said one of said intermediate substrates is substantially larger than the dielectric constant of said lowermost substrate.

9. A microstrip according to claim 5 having only two independent propagating modes in which one of said modes is c and the other of said modes is $\pi$.

10. A microstrip according to claim 9 in which said dielectric constant of said one of said intermediate substrates is substantially less than the dielectric constant of said uppermost substrate.

11. A microstrip according to claim 9 in which said dielectric constant of said one of said intermediate substrates is substantially larger than the dielectric constant of said lowermost substrate.

12. A microstrip according to claim 5 in which said dielectric constant of said one of said intermediate substrates is substantially less than the dielectric constant of said uppermost substrate.

13. A microstrip according to claim 5 in which said dielectric constant of said one of said intermediate substrates is substantially larger than the dielectric constant of said lowermost substrate.

14. A coupled microstrip according to claim 5 in which said center conductors have different widths.

15. A method for constructing multilayer, multiconductor microstrip lines having independent propagating modes for use in high-speed, high-density digital integrated circuits whereby microstrip spacing is reduced to a minimal distance and pulse distortion caused by coupling is minimized, said method comprising determining the effective dielectric constant of each of said independent propagating modes, and preparing substrate layers therefor having a dielectric constant and height effective to cause said constant of each of said modes to be substantially equal.

16. A method according to claim 15 in which the uppermost of said substrate layers has a dielectric constant substantially greater than the dielectric constant of the lowermost of said substrate layers.

* * * * *